(12) United States Patent
Lee et al.

(10) Patent No.: US 9,576,797 B2
(45) Date of Patent: Feb. 21, 2017

(54) METHOD OF FABRICATING POLYSILICON LAYER, THIN FILM TRANSISTOR, ORGANIC LIGHT EMITTING DIODE DISPLAY DEVICE INCLUDING THE SAME, AND METHOD OF FABRICATING THE SAME

(71) Applicant: Samsung Display Co., Ltd., Yongin (KR)

(72) Inventors: Dong-Hyun Lee, Yongin (KR); Ki-Yong Lee, Yongin (KR); Jin-Wook Seo, Yongin (KR); Tae-Hoon Yang, Yongin (KR); Yun-Mo Chung, Yongin (KR); Byoung-Keon Park, Yongin (KR); Kil-Won Lee, Yongin (KR); Jong-Ryuk Park, Yongin (KR); Bo-Kyung Choi, Yongin (KR); Byung-Soo So, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/721,621

(22) Filed: May 26, 2015

(65) Prior Publication Data
US 2015/0255282 A1   Sep. 10, 2015

Related U.S. Application Data

(62) Division of application No. 12/890,002, filed on Sep. 24, 2010, now Pat. No. 9,070,717.

(30) Foreign Application Priority Data

Nov. 20, 2009 (KR) .................... 10-2009-0112770

(51) Int. Cl.
*H01L 21/02* (2006.01)
*H01L 29/786* (2006.01)
(Continued)

(52) U.S. Cl.
CPC ..... *H01L 21/02672* (2013.01); *H01L 21/0206* (2013.01); *H01L 21/02488* (2013.01);
(Continued)

(58) Field of Classification Search
CPC .......... H01L 21/02672; H01L 27/1277; H01L 29/78603; H01L 29/7866; H01L 29/78672; H01L 29/78675; H01L 29/78678; H01L 29/78696; H01L 29/6675; H01L 29/66757; H01L 29/66765; H01L 21/02488; H01L 21/02532
See application file for complete search history.

(56) References Cited

U.S. PATENT DOCUMENTS

| 5,275,851 A | 1/1994 | Fonash et al. |
| 6,084,247 A * | 7/2000 | Yamazaki ........... H01L 21/2022 257/347 |

(Continued)

FOREIGN PATENT DOCUMENTS

| CN | 101211979 | 7/2008 |
| CN | 101211985 | 7/2008 |

(Continued)

OTHER PUBLICATIONS

Machine Translation of KR2007-0024017, published Mar. 2007.*
(Continued)

*Primary Examiner* — William F Kraig
*Assistant Examiner* — Sun M Kim
(74) *Attorney, Agent, or Firm* — H.C. Park & Associates, PLC (57) ABSTRACT

A method of fabricating a polysilicon layer includes forming a buffer layer on a substrate, forming a metal catalyst layer on the buffer layer, diffusing a metal catalyst into the metal catalyst layer to the buffer layer, removing the metal catalyst
(Continued)

layer, forming an amorphous silicon layer on the buffer layer, and annealing the substrate to crystallize the amorphous silicon layer into a polysilicon layer. The thin film transistor includes a substrate, a buffer layer disposed on the substrate, a semiconductor layer disposed on the buffer layer, a gate insulating layer disposed above the substrate and on the semiconductor layer, a gate electrode disposed on the gate insulating layer, a source electrode and a drain electrode both electrically connected to the semiconductor layer, and a metal silicide disposed between the buffer layer and the semiconductor layer.

25 Claims, 8 Drawing Sheets

(51) Int. Cl.
    *H01L 29/66* (2006.01)
    *H01L 27/12* (2006.01)
    *H01L 21/477* (2006.01)
    *H01L 27/32* (2006.01)

(52) U.S. Cl.
    CPC .. *H01L 21/02491* (2013.01); *H01L 21/02532* (2013.01); *H01L 21/477* (2013.01); *H01L 27/1277* (2013.01); *H01L 27/3244* (2013.01); *H01L 29/66757* (2013.01); *H01L 29/78603* (2013.01); *H01L 29/78675* (2013.01)

(56) References Cited

U.S. PATENT DOCUMENTS

| | | |
|---|---|---|
| 6,274,888 B1 | 8/2001 | Suzuki et al. |
| 6,346,437 B1 | 2/2002 | Maekawa et al. |
| 6,620,661 B2 | 9/2003 | Maekawa et al. |
| 6,784,455 B2 | 8/2004 | Maekawa et al. |
| 6,872,113 B2 | 3/2005 | Yu et al. |
| 7,390,705 B2 * | 6/2008 | Paik ................ H01L 21/02532 257/E21.133 |
| 2004/0029401 A1 | 2/2004 | Matsugai et al. |
| 2005/0116292 A1 | 6/2005 | Koo et al. |
| 2005/0275019 A1 | 12/2005 | Seo et al. |
| 2005/0285102 A1 | 12/2005 | Koo et al. |
| 2008/0157083 A1 | 7/2008 | Park et al. |
| 2008/0157116 A1 | 7/2008 | Park et al. |
| 2008/0296565 A1 | 12/2008 | Park et al. |
| 2009/0166636 A1 | 7/2009 | Park et al. |
| 2010/0327281 A1 | 12/2010 | Nakajima et al. |

FOREIGN PATENT DOCUMENTS

| | | |
|---|---|---|
| CN | 101295679 | 10/2008 |
| CN | 101315883 | 12/2008 |
| EP | 1 939 933 | 7/2008 |
| JP | 07-074365 | 3/1995 |
| JP | 08-139021 | 5/1996 |
| JP | 08-148425 | 6/1996 |
| JP | 2000-031057 | 1/2000 |
| JP | 2006-054415 | 2/2006 |
| JP | 2006-216658 | 8/2006 |
| JP | 2008-166703 | 7/2008 |
| JP | 2008-166785 | 7/2008 |
| JP | 2008-172259 | 7/2008 |
| KR | 10-2003-0057150 | 7/2003 |
| KR | 10-2004-0040762 | 5/2004 |
| KR | 10-0470274 | 2/2005 |
| KR | 10-2005-0117133 | 12/2005 |
| KR | 10-2007-0024017 | 3/2007 |
| KR | 10-0742382 | 7/2007 |
| KR | 10-2008-0054777 | 6/2008 |

OTHER PUBLICATIONS

Kawase et al., "Densification of Chemical Vapor Deposition Silicon Dioxide Film Using Ozone Treatment", Japanese Journal of Applied Physics, 48, 2009, 101401, pp. 1-7.

Non-Final Office Action issued on Apr. 11, 2013, in U.S. Appl. No. 12/890,002.

Final Office Action issued on Oct. 11, 2013, in U.S. Appl. No. 12/890,002.

Non-Final Office Action issued on Aug. 1, 2014, in U.S. Appl. No. 12/890,002.

Notice of Allowance issued on Mar. 18, 2015, in U.S. Appl. No. 12/890,002.

* cited by examiner

METHOD OF FABRICATING POLYSILICON LAYER, THIN FILM TRANSISTOR, ORGANIC LIGHT EMITTING DIODE DISPLAY DEVICE INCLUDING THE SAME, AND METHOD OF FABRICATING THE SAME

CROSS-REFERENCE TO RELATED APPLICATION

This application is a Divisional of U.S. patent application Ser. No. 12/890,002, filed on Sep. 24, 2010, and claims the benefit of Korean Patent Application No. 10-2009-0112770, filed on Nov. 20, 2009, each of which is hereby incorporated by reference for all purposes as if fully set forth herein.

BACKGROUND

1. Field

Aspects of the present invention relate to a method of fabricating a polysilicon layer, a thin film transistor using the same, an organic light emitting diode display device including the same, and a method of fabricating the same. More particularly, aspects of the present invention relate to a method of fabricating a polysilicon layer including diffusing a metal catalyst in a buffer layer and crystallizing an amorphous silicon layer into a polysilicon layer using the metal catalyst in the buffer layer, a thin film transistor having the reduced residual metal catalyst and improved characteristics when it is used as a semiconductor layer, an organic light emitting diode display device including the same, and a method of fabricating the same.

2. Description of the Related Art

In general, polysilicon layers have advantages of high electric field effect mobility, applicability to high speed operation circuits, and enablement of complementary metal-oxide semiconductor (CMOS) circuits, and thus, the polysilicon layers are widely used as semiconductor layers of thin film transistors (TFTs). The TFTs using the polysilicon layers are used as active devices of active matrix liquid crystal displays (AMLCDs) and as switching devices and drive devices of organic light emitting diode (OLED) display devices.

Methods of crystallizing an amorphous silicon layer into a polysilicon layer include solid phase crystallization (SPC), excimer laser crystallization (ELC), metal induced crystallization (MIC), metal induced lateral crystallization (MILC), and other similar methods.

Currently, methods of crystallizing amorphous silicon using metal are being widely researched due to an advantage of a lower crystallization temperature and a shorter crystallization time than that of the SPC. Crystallization methods using metal include MIC, MILC, super grain silicon (SGS) crystallization, and other similar methods. However, the above methods of using metal as a catalyst have a contamination problem due to the metal catalyst, and thus, device characteristics of the TFT may deteriorate.

SUMMARY

Aspects of the present invention provide a method of fabricating a polysilicon layer capable of reducing the amount of a metal catalyst remaining in a semiconductor layer crystallized using the metal catalyst, a TFT having improved electrical characteristics, a method of fabricating the same, an OLED display device, and a method of fabricating the same.

According to an aspect of the present invention, a method of fabricating a polysilicon layer includes: forming a buffer layer on a substrate; forming a metal catalyst layer on the buffer layer; diffusing a metal catalyst into the metal catalyst layer to the buffer layer; removing the metal catalyst layer; forming an amorphous silicon layer on the buffer layer; and annealing the substrate to crystallize the amorphous silicon layer into a polysilicon layer.

According to another aspect of the present invention, a thin film transistor includes: a substrate; a buffer layer disposed on the substrate; a semiconductor layer disposed on the buffer layer; a gate insulating layer disposed above both the substrate and the semiconductor layer; a gate electrode disposed on the gate insulating layer; a source electrode and a drain electrode both electrically connected to the semiconductor layer; and a metal silicide disposed between the buffer layer and the semiconductor layer.

A method of fabricating the thin film transistor, an organic light emitting diode display device including the same, and a method of fabricating the same are also provided.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout.

The embodiments are described below in order to explain the present invention by referring to the figures.

As referred to herein, it is to be understood that where is stated herein that one element, film or layer is "formed on" or "disposed on" a second element, layer or film, the first element, layer or film may be formed or disposed directly on the second element, layer or film or there may be intervening elements, layers or films between the first element, layer or film and the second element, layer or film. Further, as used herein, the term "formed on" is used with the same meaning as "located on" or "disposed on" and is not meant to be limiting regarding any particular fabrication process.

Figure 1A:
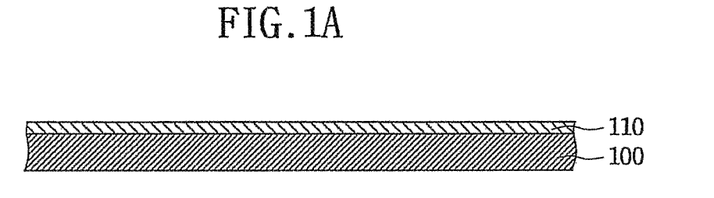
FIGS. 1A to 1D are views explaining a method of fabricating a polysilicon layer in accordance with an embodiment of the present invention.

FIGS. 1A to 1D are views explaining a crystallization process in accordance with an embodiment of the present invention. First, as shown in FIG. 1A, a buffer layer 110 is formed on a substrate 100 formed of glass or plastic. The buffer layer 110 is formed of a single layer or a combination layer selected from insulating layers such as a silicon oxide layer and a silicon nitride layer using chemical vapor deposition (CVD) or physical vapor deposition (PVD). However, aspects of the present invention are not limited thereto and the buffer layer 110 may be formed of other suitable materials or combinations thereof. A lower layer is formed of the silicon nitride layer to prevent diffusion of impurities generated by the substrate, and an upper layer, formed as the buffer layer 110 diffusing a metal catalyst, is formed of the silicon oxide layer in consideration of adhesion characteristics to amorphous silicon to be deposited.

The buffer layer 110 prevents diffusion of moisture or impurities generated from the substrate 100 or provides the metal catalyst diffused into the buffer layer to crystallize the silicon layer through annealing, thereby forming a metal silicide to crystallize the silicon layer. The buffer layer 110 is formed to a thickness of 10 Å to 5000 Å. When the thickness is larger than 5000 Å, the substrate 100 may be bent or shrunk during the annealing for crystallization, and when the thickness is smaller than 10 Å, the amount of the metal catalyst present in the buffer layer is reduced. Therefore, the amount of the metal catalyst diffused into an amorphous silicon layer to be formed later is also reduced, making it difficult to crystallize the polysilicon layer.

Figure 1B:
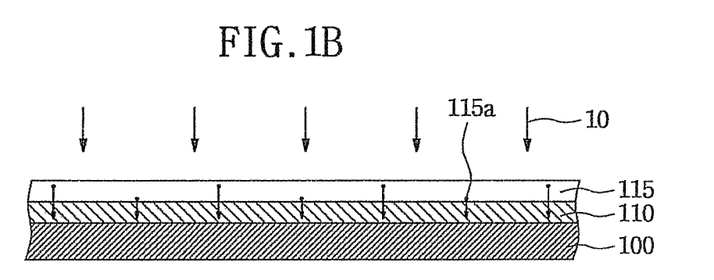

Referring to FIG. 1B, the metal catalyst is deposited on the buffer layer 110 to form a metal catalyst layer 115. The metal catalyst includes any one selected from the group consisting of Ni, Pd, Ag, Au, Al, Sn, Sb, Cu, Ti, and Cd. However, aspects of the present invention are not limited thereto, and other suitable materials may be used as the metal catalyst. In addition, the metal catalyst layer 115 is formed on the buffer layer 110 at a surface density of $10^{11}$ to $10^{15}$ atoms/cm$^2$. When the surface density of the metal catalyst is smaller than $10^{11}$ atoms/cm$^2$, the amount of seeds, or, in other words, cores for crystallization, is too small to crystallize the amorphous silicon layer into the polysilicon layer through SGS. When the surface density of the metal catalyst is larger than $10^{15}$ atoms/cm$^2$, the amount of the metal catalyst diffused into the amorphous silicon layer is increased and the amount of the remaining metal catalyst is also increased, thus deteriorating characteristics of the semiconductor layer formed by patterning the polysilicon layer.

Next, the substrate 100 is annealed in an arrow direction 10 to diffuse the metal catalyst of the metal catalyst layer 115 into the buffer layer 110, and then, the metal catalyst layer 115 is removed. The annealing is performed at a temperature of 200° C. to 900° C. for several seconds to several hours to diffuse a metal catalyst A. In this case, it is possible to prevent deformation of the substrate due to excessive annealing when the annealing is performed at that temperature for that time, thereby reducing manufacturing costs and increasing a yield. The annealing uses any one of a furnace process, a rapid thermal annealing (RTA) process, an ultraviolet (UV) process, and a laser process.

Figure 1C:
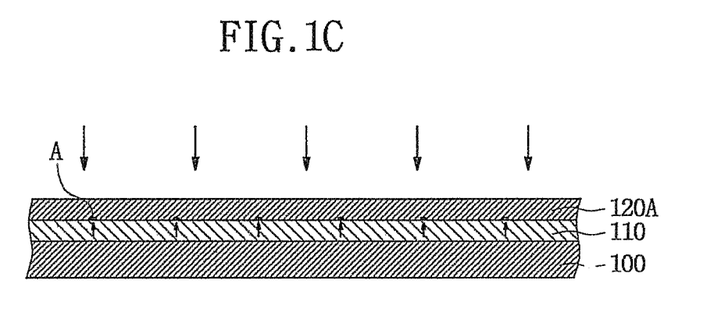

Referring to FIG. 1C, an amorphous silicon layer 120A is formed on the buffer layer 110 including the metal catalyst A. When the substrate 100 is annealed, the amorphous silicon layer 120A is crystallized into a polysilicon layer 120B by the metal catalyst A remaining in the buffer layer 110. That is, the metal catalyst A diffused into the buffer layer 110 is bonded to silicon of the amorphous silicon layer 120A to form a metal silicide, and the metal silicide forms a seed, which is a core for crystallization. As a result, crystal grows from the seed to crystallize the amorphous silicon layer into the polysilicon layer.

Before forming the amorphous silicon layer 120A, an insulating layer formed of a silicon nitride layer, a silicon oxide layer, or a combination layer thereof, is formed on the buffer layer 110. However, aspects of the present invention are not limited thereto, and the insulating layer may not be formed on the buffer layer 110. When the insulating layer is formed as described above, since the amount of the metal catalyst A diffused into the amorphous silicon layer 120A is adjustable, it is possible to increase the size of the crystal and reduce the amount of the metal catalyst in the semiconductor layer 120 (see FIG. 2D).

Although the crystallization has been described as being performed after removing the metal catalyst layer 115 and before annealing the amorphous silicon layer 120A, the crystallization may be performed without removing the metal catalyst layer 115.

Figure 1D:
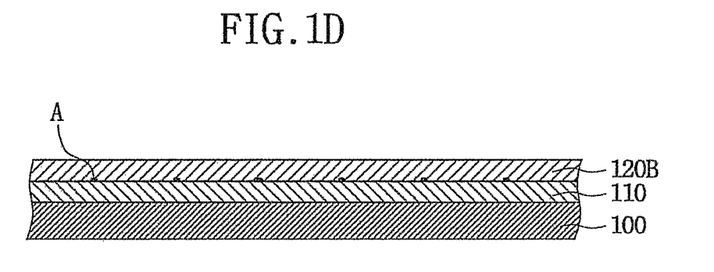

Referring to FIG. 1D, the metal catalyst A, which is also referred to as a seed A, formed as described above is disposed between the polysilicon layer 120B and the buffer layer 110 so that the seed A is disposed up to approximately 10 nm below where the buffer layer 110 and the polysilicon layer 120B contact. In addition, a crystal grows from the seed A to crystallize the amorphous silicon layer 120A into the polysilicon layer 120B. Thereby, the polysilicon layer 120B, in accordance with aspects of the present invention, is manufactured.

Figure 1E:
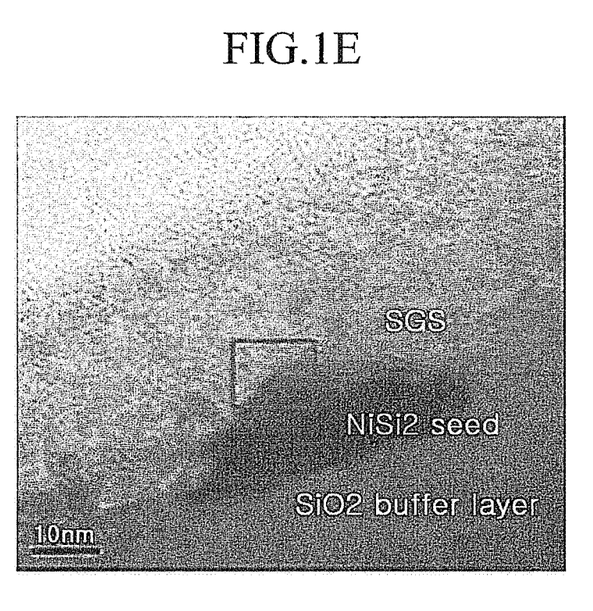
FIG. 1E is a photograph of a seed group region of a polysilicon layer crystallized by a metal catalyst.
Figure 1F:
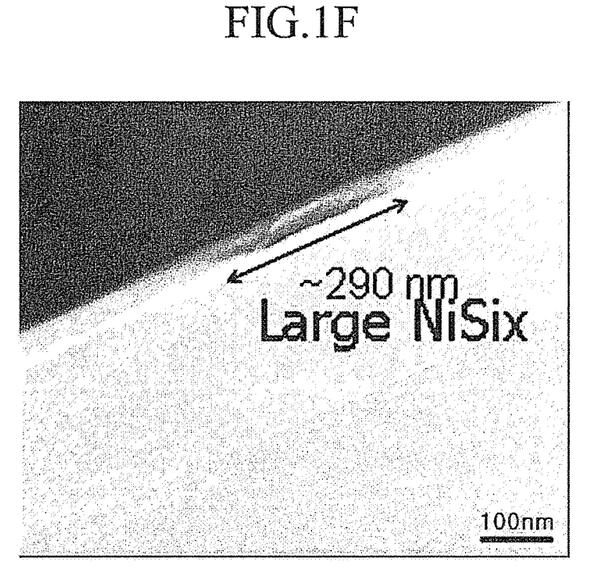
FIG. 1F is a photograph of a seed group region of a polysilicon layer in accordance with aspects of the present invention.

FIG. 1E is a cross-sectional transmission electron micrograph (TEM) photograph of a seed group region of the polysilicon layer 120B crystallized by the metal catalyst A in the buffer layer 110 as described above. FIG. 1F is a cross-sectional TEM photograph of a seed group region of the polysilicon layer 120B crystallized by the metal catalyst A diffused from an upper part of the amorphous silicon layer 120A through a conventional SGS method.

As shown in FIGS. 1E and 1F, it is appreciable that the polysilicon layer, in accordance with aspects of the present invention, includes a seed group region having a plane shape in which seeds are collected and formed at an interface between the buffer layer 110 and the polysilicon layer 120B. Furthermore, it is appreciable that a triangular cone shaped seed group region is disposed at an interface between the buffer layer 110 and the polysilicon layer 120B formed through crystallization by the metal catalyst A diffused from an upper portion of the conventional amorphous silicon layer 120A, for example, SGS. The triangular cone shaped seed group occurs because the annealing for diffusion of the metal catalyst A after deposition on the buffer layer 110 can provide a seed group region having a widely spread shape according to aspects of the present invention. In contrast, in the conventional SGS method, the metal catalyst A is directly diffused downward from the upper surface to be gathered between the polysilicon layer 120B and the buffer layer 110, thus forming a seed group region different from the crystallization according to aspects of the present invention.

Figure 1G:
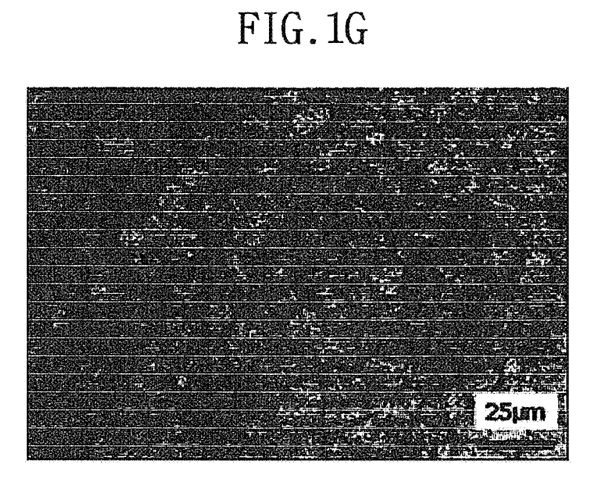
FIG. 1G is a photograph of the polysilicon layer secco-etched in accordance with aspects of the present invention.
Figure 1H:
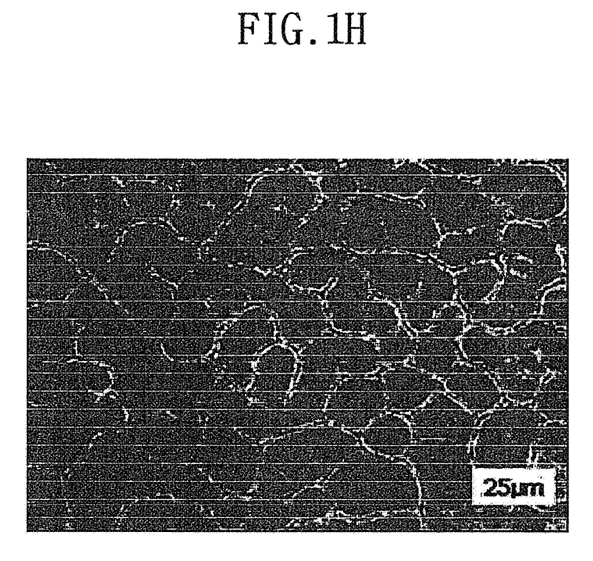
FIG. 1H is a photograph of a general polysilicon layer secco-etched by a metal catalyst.

FIG. 1G is a photograph in which the polysilicon layer 120B, in accordance with aspects of the present invention, is secco-etched. FIG. 1H is a photograph in which the polysilicon layer 110B, having the metal catalyst A diffused from an upper portion of the amorphous silicon layer 120A to be crystallized, is secco-etched. Comparing FIG. 1G with FIG. 1H, while the metal catalyst A, or seed A, in a grain boundary cannot be observed from FIG. 1G, the seed A in the grain boundary can be clearly observed from FIG. 1H by the conventional SGS method. The grain boundary cannot be observed in FIG. 1G because the crystallization, according to aspects of the present invention, provides the seed A included in the interface of the buffer layer 110 and the amorphous silicon layer 120A and the seed A is widely spread in the buffer layer 110.

Figure 1I:
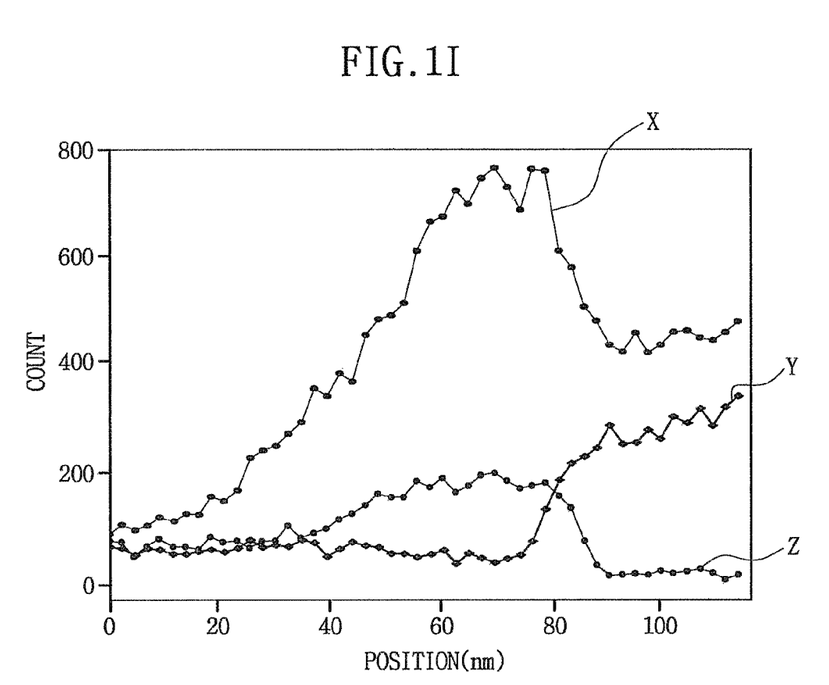
FIG. 1I is a graph showing an energy dispersive x-ray (EDS) analysis result representing positions of the polysilicon and the seed in accordance with the present invention.
Figure 1J:
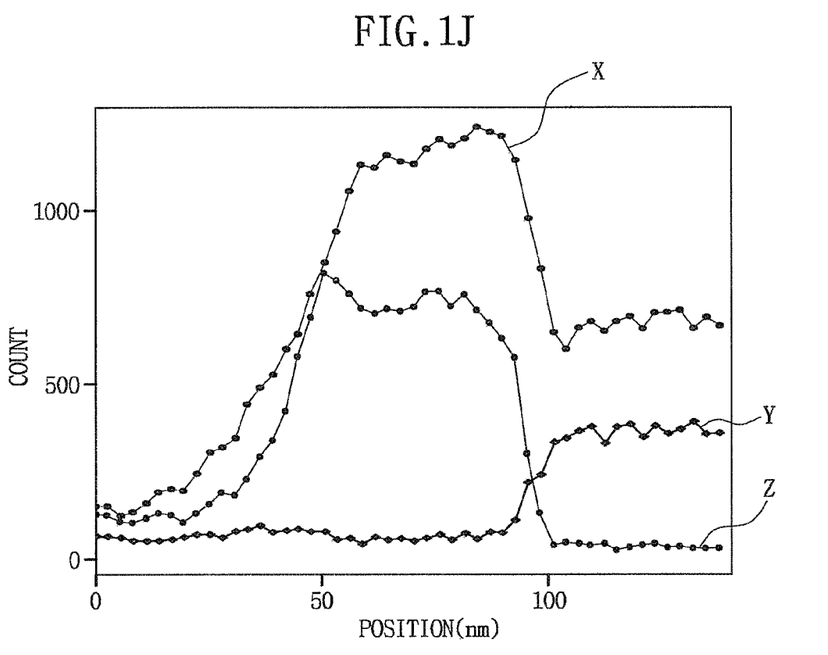
FIG. 1J is a graph showing an EDS analysis result representing positions of the polysilicon and the seed of a general polysilicon layer crystallized by a metal catalyst.

FIG. 1I is a graph showing an energy dispersive x-ray (EDS) analysis result in the seed group region of the polysilicon layer 120B in accordance with aspects of the present invention, and FIG. 1J is a graph showing the EDS analysis result in the seed group region of the general polysilicon layer X crystallized by a metal catalyst A (see FIG. 1D). As described above, it is appreciable that while a metal silicide Z, in accordance with aspects of the present invention, is present at a position about 10 nm in a buffer layer Y when positions of the polysilicon layer X, the metal silicide Z and the buffer layer Y in FIG. 1I are observed, a large amount of the metal silicide Z is present only in the polysilicon layer X and the interface in FIG. 1J, but is not present in the buffer layer Y.

Therefore, the polysilicon layer X crystallized by the metal catalyst A (see FIG. 1D) diffused into the buffer layer Y, in accordance with aspects the present invention, is different in shape of a polysilicon layer, is different with respect to a seed and is also different with respect to a shape of a seed group region existing in a silicon layer and a buffer layer of a conventional method of crystallization. Thus, according to aspects of the present invention, it is possible to form a high quality semiconductor device.

Figure 2A:
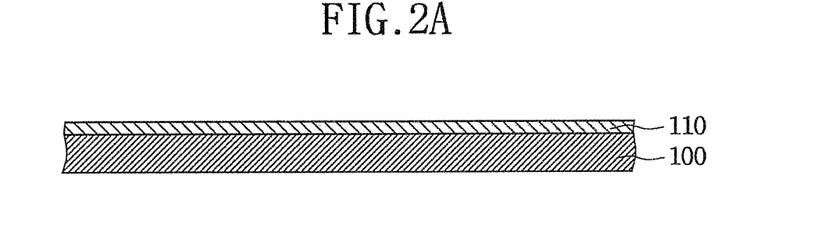
FIGS. 2A to 2E are views of a TFT in accordance with a second embodiment of the present invention.

FIGS. 2A to 2E are views of a TFT in accordance with a second embodiment of the present invention, which is formed using the method of fabricating the polysilicon layer similar to the first embodiment. Referring to FIG. 2A, a substrate 100 is prepared, and a buffer layer 110 is formed on the substrate 100.

Figure 2B:
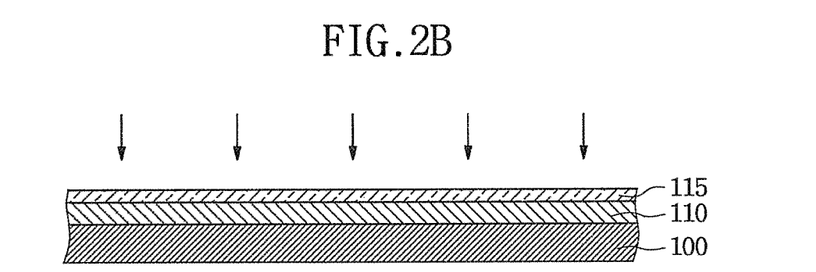

Referring to FIG. 2B, a metal catalyst layer 115 is formed on the buffer layer 110, and then, the substrate 100 is annealed to diffuse a metal catalyst A (see FIG. 2C) in the metal catalyst layer 115 into the buffer layer 110.

Figure 2C:
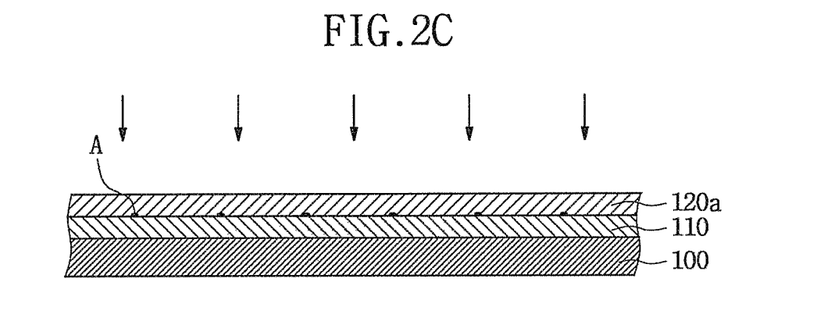

Referring to FIG. 2C, after removing the metal catalyst layer 115, an amorphous silicon layer 120A is formed on the buffer layer 110 and then annealed to crystallize the amorphous silicon layer 120A into a polysilicon layer (not shown) using the metal catalyst A present in the buffer layer 110.

Similar to the first embodiment, before forming the amorphous silicon layer 120A, a silicon oxide layer, a silicon nitride layer or a combination layer thereof is formed, and then, the amorphous silicon layer 120a is formed and annealed to be crystallized. Although the crystallization has been described as being performed after removing the metal catalyst layer 115 and before annealing the amorphous silicon layer, aspects of the present invention are not limited thereto and the crystallization may be performed without removing the metal catalyst layer.

Figure 2D:
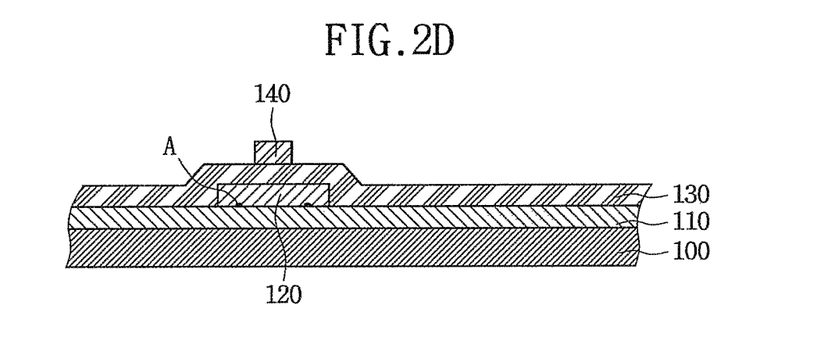

Referring to FIG. 2D, the crystallized polysilicon layer is patterned to form a semiconductor layer 120. Then, a gate insulating layer 130 is formed on the entire surface of the substrate 100, and a gate electrode 140 is formed to correspond to the semiconductor layer 120. The gate insulating layer 130 is a silicon oxide layer, a silicon nitride layer, or a combination layer thereof. However, aspects of the present invention are not limited thereto and the gate insulating layer 130 may be formed of other suitable materials. The gate electrode 140 is formed on the gate insulating layer 130 by forming a single layer of aluminum or an aluminum alloy such as aluminum-neodymium (Al—Nd), or a combination layer, in which an aluminum alloy is deposited on a chromium (Cr) or molybdenum (Mo) alloy, as a gate electrode metal layer (not shown), and etching the gate electrode metal layer through photolithography and etching. However, aspects of the present invention are not limited thereto, and the gate electrode 140 may be formed of other suitable materials.

Figure 2E:
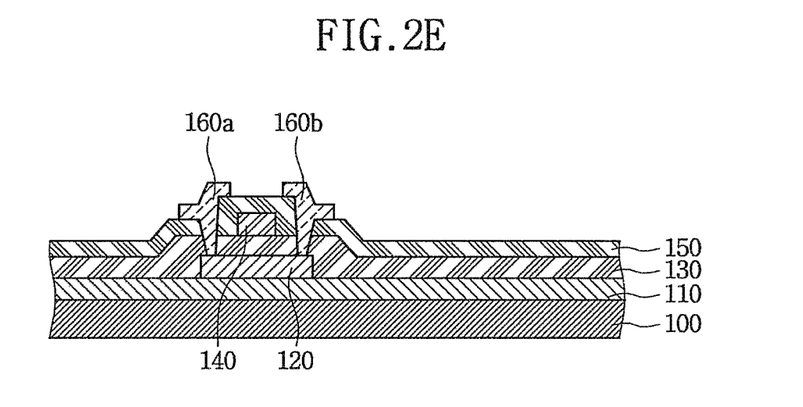

Referring to FIG. 2E, an interlayer insulating layer 150 is formed on the entire surface of the substrate 100. Source electrode 160a and drain electrode 160b are electrically connected to the semiconductor layer 120 and are formed to complete a thin-film transistor (TFT) in accordance with the second embodiment of the present invention.

Figure 3A:
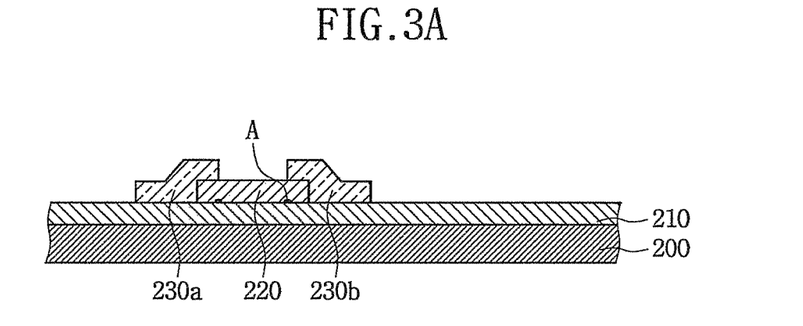
FIGS. 3A to 3B are views of a TFT in accordance with a third embodiment of the present invention.
Figure 3B:
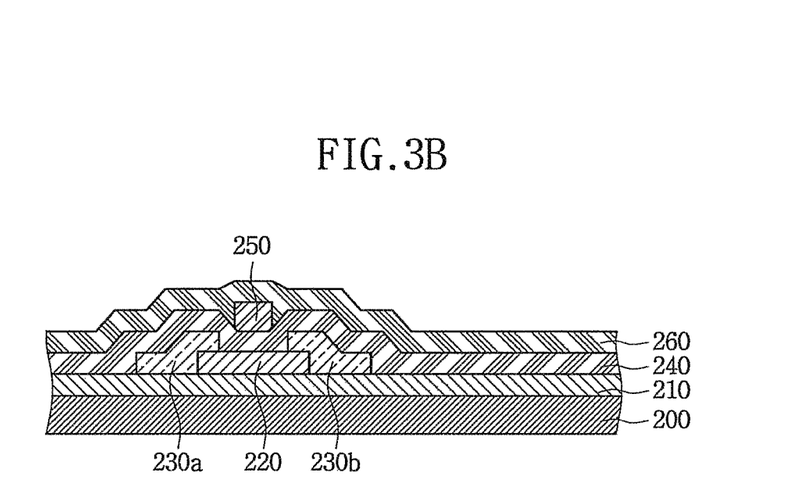

A third embodiment relates to a TFT formed using the method of fabricating a polysilicon layer similar to that of the first embodiment. FIGS. 3A and 3B show the TFT. First, referring to FIG. 3A, a substrate 200 is prepared, and a buffer layer 210 is formed on the substrate 200. Then, a semiconductor layer 220 formed of the polysilicon layer (not shown) crystallized using the method of the first embodiment is formed. Since the polysilicon layer (not shown) formed by a method similar to that of the first embodiment is patterned to form the semiconductor layer 220, a seed A is between the semiconductor layer 220 and the buffer layer 210. Next, a portion of the semiconductor layer 220 is opened to form source electrode 230a and drain electrode 230b connected to the semiconductor layer 220.

Referring to FIG. 3B, a gate insulating layer 240 is formed on the entire surface of the substrate 200. Then, a gate electrode 250 is formed to correspond to the semiconductor layer 220, and an interlayer insulating layer 260 is formed above the entire surface of the substrate 200, completing a TFT in accordance with the third embodiment of the present invention.

Figure 4A:
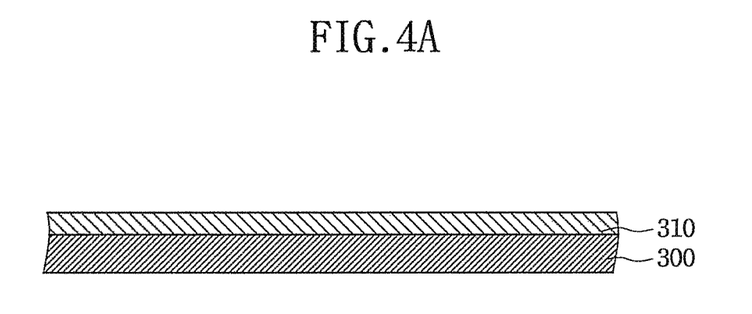
FIGS. 4A to 4C are views of a TFT in accordance with a fourth embodiment of the present invention.
Figure 4B:
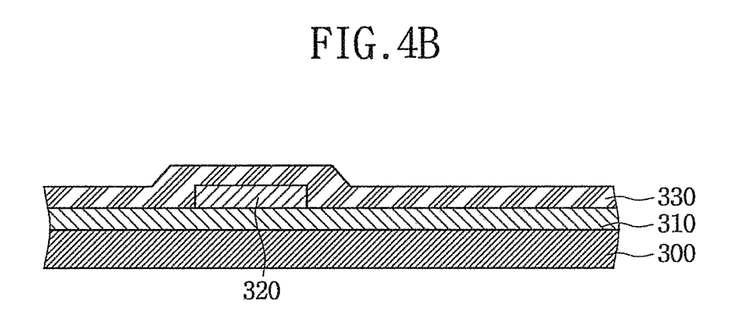

FIGS. 4A and 4B are views of a TFT formed using the method of fabricating a polysilicon layer in accordance with the first embodiment of the present invention.

Referring to FIG. 4A, a buffer layer 310, into which a metal catalyst is diffused through a method similar to that as described with respect to the embodiment of FIG. 1, is formed on a substrate 300. Then, the surface of the buffer layer 310 is cleaned with ozone ($O_3$).

Referring to FIG. 4B, a semiconductor layer 320 formed of the polysilicon layer (not shown) through a method similar to that as described with respect to the embodiment of FIG. 1 is formed on the buffer layer 310. Since an oxide layer is formed on the surface of the buffer layer 310 due to the $O_3$ cleaning, it is possible to form a polysilicon layer (not shown) having a larger grain size by functioning as a diffusion layer between the buffer layer 310 and an amorphous silicon layer crystallized to form the semiconductor layer 320 and adjusting the metal catalyst diffused into an amorphous silicon layer (not shown).

Figure 4C:
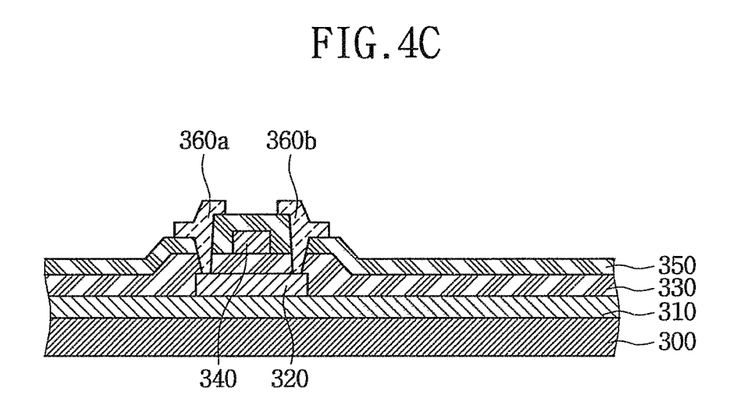

Then, a gate insulating layer 330, a gate electrode 340, an interlayer insulating layer 350, and source electrode 360a and drain electrode 360b are formed on the substrate 300 to complete a TFT in accordance with the fourth embodiment of the present invention. The fourth embodiment is manufactured in a manner similar to that as described with respect to as the second embodiment, except that the fourth embodiment further includes cleaning the buffer layer using $O_3$.

Figure 5A:
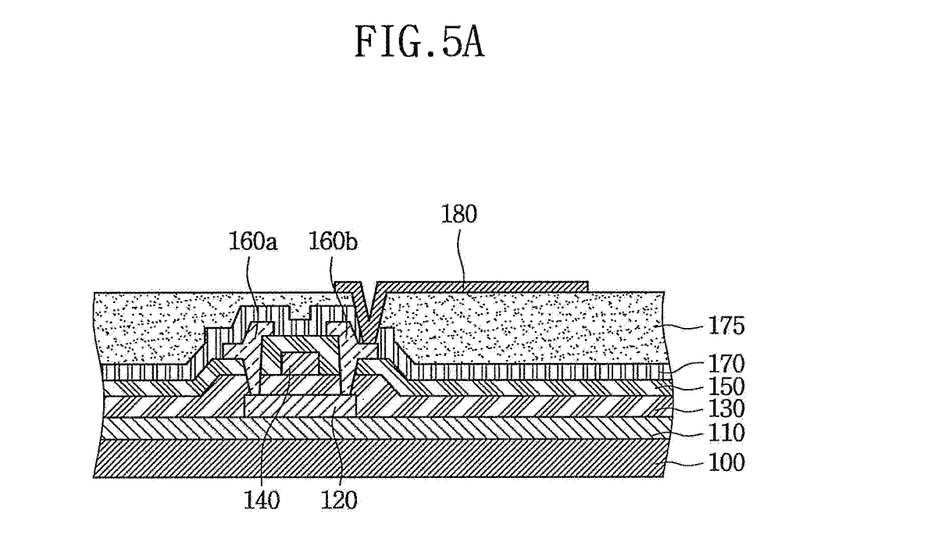
FIGS. 5A and 5B are views of an OLED display device in accordance with a fifth embodiment of the present invention.
Figure 5B:
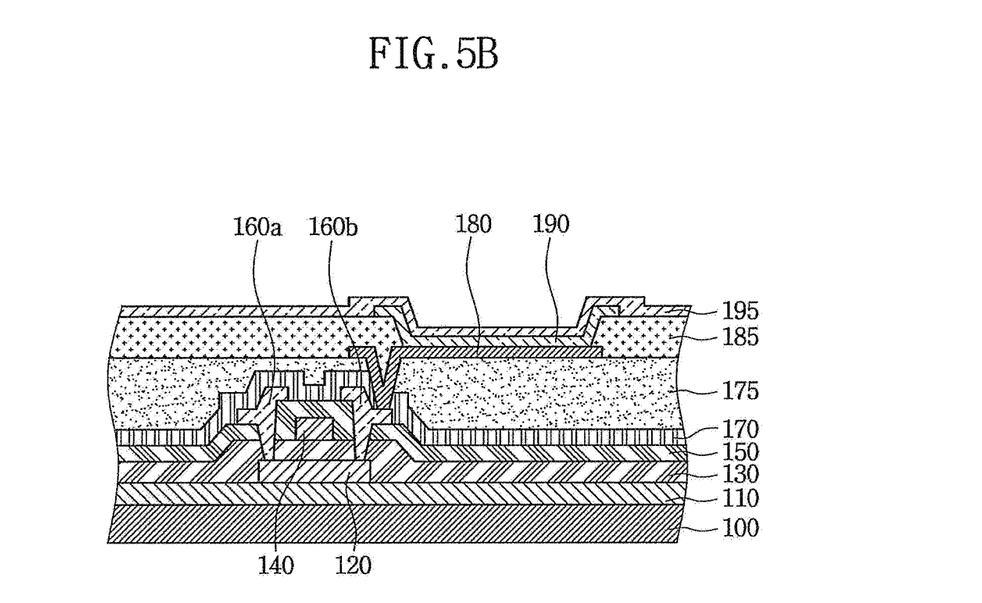

FIGS. 5A to 5B are views of an organic light emitting diode (OLED) display device in accordance with a fifth embodiment of the present invention. The fifth embodiment relates to an OLED display device including the TFT formed in the second embodiment, and thus, detailed descriptions thereof will be omitted. Referring to FIG. 5A, a passivation layer 170 is formed on the entire surface of a substrate 100 including the TFT formed in the first embodiment, and a planarization layer 175 is formed on the passivation layer 170. However, aspects of the present invention are not limited thereto and the passivation layer 170 may be omitted. Next, a first electrode 180 is formed to be electrically connected to one of the source electrode 160a and the drain electrode 160b of the TFT.

Referring to FIG. 5B, a pixel defining layer 185 opening a portion of the first electrode 180 and defining a pixel is formed. Then, an organic layer 190 including an organic emission layer (not shown) is formed on the first electrode 180. Although not shown, the organic layer 190 may further include a hole injection layer, a hole transport layer, an electron transport layer, and other similar features. A second electrode 195 is formed on an entire surface of the substrate 100 to complete an OLED display device in accordance with the fifth embodiment of the present invention.

As can be seen from the foregoing, after diffusing a metal catalyst into a buffer layer, a metal silicide is formed at an interface of an amorphous silicon layer to perform crystallization using the metal catalyst in the buffer layer so that the amounts of the metal catalyst and the metal silicide in the amorphous silicon layer can be minimized, and thus it is possible to provide a TFT having improved characteristics of a semiconductor layer, and an OLED display device including the same.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a polysilicon layer, comprising:
   forming a buffer layer on a substrate;
   forming a metal catalyst layer directly on the buffer layer;
   diffusing a metal catalyst in the metal catalyst layer into the buffer layer;
   removing all of the metal catalyst layer;
   forming an amorphous silicon layer on the buffer layer;
   annealing the substrate to crystallize the amorphous silicon layer into a polysilicon layer; and
   wherein the buffer layer is formed of any one selected from a silicon oxide layer, a silicon nitride layer, and a combination layer thereof.

2. The method according to claim 1, wherein the metal catalyst includes any one selected from the group consisting of Ni, Pd, Ag, Au, Al, Sn, Sb, Cu, Ti and Cd.

3. The method according to claim 1, wherein the buffer layer is formed to a thickness of about 10 Å to about 5000 Å.

4. The method according to claim 1, wherein the metal catalyst is diffused into the buffer layer through the annealing of the substrate.

5. The method according to claim 1, wherein the annealing is performed after the forming of the amorphous silicon layer on the buffer layer.

6. The method according to claim 1, wherein crystallizing the amorphous silicon layer is performed by growing a crystal from a metal silicide disposed between the buffer layer and the amorphous silicon layer.

7. The method according to claim 1, further comprising, after removing the metal catalyst layer, forming a silicon oxide layer, a silicon nitride layer, or a combination layer thereof on the buffer layer.

8. A method of fabricating a thin film transistor, comprising:
   forming a buffer layer on a substrate;
   forming a metal catalyst layer directly on the buffer layer;
   diffusing a metal catalyst in the metal catalyst layer into the buffer layer;
   removing all of the metal catalyst layer;
   forming an amorphous silicon layer on the buffer layer;
   annealing the substrate to crystallize the amorphous silicon layer into a polysilicon layer;
   patterning the polysilicon layer to form a semiconductor layer; forming a gate insulating layer on the substrate;
   forming a gate electrode on the gate insulating layer;
   forming source and drain electrodes insulated from the gate electrode and connected to the semiconductor layer, wherein the annealing is performed after forming the amorphous silicon layer on the buffer layer; and
   wherein the buffer layer is formed of any one selected from a silicon oxide layer, a silicon nitride layer, and a combination layer thereof.

9. The method according to claim 8, wherein the metal catalyst layer includes a metal catalyst at a surface density of $10^{11}$ atoms/cm$^2$ to $10^{15}$ atoms/cm$^2$.

10. The method according to claim 8, wherein the buffer layer is formed to a thickness of about 10 Å to about 5000 Å.

11. The method according to claim 8, wherein the metal catalyst is diffused into the buffer layer through the annealing of the substrate.

12. The method according to claim 8, wherein the annealing is performed at a temperature of about 200° C. to about 900° C.

13. The method according to claim 12, further comprising, after removing the metal catalyst layer, forming a silicon oxide layer, a silicon nitride layer, or a combination layer thereof on the buffer layer.

14. A method of fabricating a thin film transistor, comprising:
   forming a buffer layer on a substrate;
   forming a metal catalyst layer directly on the buffer layer;
   removing all of the metal catalyst layer;
   cleaning the substrate using ozone;
   forming an amorphous silicon layer on the buffer layer;
   annealing the substrate to crystallize the amorphous silicon layer into a polysilicon layer;
   patterning the polysilicon layer to form a semiconductor layer; forming a gate insulating layer on the substrate;
   forming a gate electrode on the gate insulating layer;
   forming a source electrode and a drain electrode, both insulated from the gate electrode and both connected to the semiconductor layer,
   wherein the annealing is performed after forming the amorphous silicon layer on the buffer layer; and
   wherein the buffer layer is formed of any one selected from a silicon oxide layer, a silicon nitride layer, and a combination layer thereof.

15. The method according to claim 14, wherein the metal catalyst layer includes a metal catalyst at a surface density of $10^{11}$ atoms/cm$^2$ to $10^{15}$ atoms/cm$^2$.

16. The method according to claim 14, wherein the buffer layer is formed to a thickness of about 10 Å to about 5000 Å.

17. The method according to claim 14, wherein the metal catalyst is diffused into the buffer layer through the annealing of the substrate.

18. The method according to claim 14, wherein the annealing is performed at a temperature of about 200° C. to about 900° C.

19. The method according to claim 14, further comprising, after removing the metal catalyst layer, forming a silicon oxide layer, a silicon nitride layer, or a combination layer thereof on the buffer layer.

20. A method of fabricating an organic light emitting diode display device, comprising:
    forming a buffer layer on a substrate;
    forming a metal catalyst layer directly on the buffer layer;
    removing all of the metal catalyst layer;
    forming an amorphous silicon layer on the buffer layer;
    annealing the substrate to crystallize the amorphous silicon layer into a polysilicon layer;
    patterning the polysilicon layer to form a semiconductor layer; forming a gate insulating layer on the substrate;
    forming a gate electrode on the gate insulating layer;
    forming a source electrode and a drain electrode both insulated from the gate electrode and both connected to the semiconductor layer;
    forming a first electrode electrically connected to one of the source electrode, the drain electrode, an organic layer, and a second electrode,
    wherein the annealing is performed after the forming of the amorphous silicon layer on the buffer layer; and
    wherein the buffer layer is formed of any one selected from a silicon oxide layer, a silicon nitride layer, and a combination layer thereof.

21. The method according to claim 20, wherein the metal catalyst layer includes a metal catalyst at a surface density of $10^{11}$ atoms/cm$^2$ to $10^{15}$ atoms/cm$^2$.

22. The method according to claim 20, wherein the buffer layer is formed to a thickness of about 10 Å to about 5000 Å.

23. The method according to claim 20, wherein the metal catalyst is diffused into the buffer layer through the annealing of the substrate.

24. The method according to claim 20, wherein the annealing is performed at a temperature of about 200° C. to about 900° C.

25. The method according to claim 20, further comprising, after removing the metal catalyst layer, forming a silicon oxide layer, a silicon nitride layer, or a combination layer thereof on the buffer layer.

* * * * *